US007864544B2

(12) United States Patent
Smith et al.

(10) Patent No.: US 7,864,544 B2
(45) Date of Patent: Jan. 4, 2011

(54) PRINTED CIRCUIT BOARD ASSEMBLY

(75) Inventors: Mark W. Smith, El Paso, TX (US); Christopher A. Brandon, El Paso, TX (US)

(73) Assignee: Delphi Technologies, Inc., Troy, MI (US)

( * ) Notice: Subject to any disclaimer, the term of this patent is extended or adjusted under 35 U.S.C. 154(b) by 743 days.

(21) Appl. No.: 11/888,611

(22) Filed: Aug. 1, 2007

(65) Prior Publication Data

US 2009/0034222 A1    Feb. 5, 2009

(51) Int. Cl.
*H01R 9/00* (2006.01)
(52) U.S. Cl. .................. 361/774; 361/770; 361/792
(58) Field of Classification Search ......... 361/770–774, 361/792; 439/53, 65, 327–330
See application file for complete search history.

(56) References Cited

U.S. PATENT DOCUMENTS

| | | | |
|---|---|---|---|
| 3,624,587 A | 11/1971 | Conrad | |
| 4,715,820 A * | 12/1987 | Andrews et al. | 439/59 |
| 5,451,815 A * | 9/1995 | Taniguchi et al. | 257/696 |
| 5,599,192 A * | 2/1997 | Olson | 439/65 |
| 5,754,411 A | 5/1998 | Woychik | |
| 6,496,384 B1 | 12/2002 | Morales et al. | |
| 6,619,973 B2 * | 9/2003 | Perino et al. | 439/327 |
| 6,903,941 B2 | 6/2005 | Paola | |

FOREIGN PATENT DOCUMENTS

| | | |
|---|---|---|
| DE | 4236268 | 5/1993 |
| EP | 0089452 | 9/1983 |
| FR | 2818869 | 6/2002 |
| WO | WO2004/080140 | 9/2004 |

* cited by examiner

*Primary Examiner*—Tuan T Dinh
(74) *Attorney, Agent, or Firm*—Thomas N. Twomey

(57) ABSTRACT

A printed circuit board assembly includes a first printed circuit board having a plurality of electrical traces that is attached to a second printed circuit board having a plurality of electrical traces in a substantially perpendicular fashion. The first printed circuit board has a plurality of male terminal tabs that fit into a plurality of female terminal slots of the second printed circuit board to make a plurality of electrical connections between the electrical traces of the first printed circuit board and the electrical traces of the second printed circuit board. The assembly has at least two mechanical connections between the first printed circuit board and the second printed circuit board comprising connector blades that are substantially perpendicular to the first printed circuit board and to the second printed circuit board. The connector blades may also make electrical connections between electrical traces of the first and second printed circuit boards. A method of making an alternate printed circuit board for the assembly involves punching or drilling the alternate printed circuit board to provide a plurality of female terminals in an elongate slot.

1 Claim, 3 Drawing Sheets

US 7,864,544 B2

PRINTED CIRCUIT BOARD ASSEMBLY

BACKGROUND OF THE INVENTION

This invention relates generally to a printed circuit board assembly in which at least one printed circuit board is connected electrically and mechanically to another printed circuit board and to a method of making a printed circuit board that can be used in such a printed circuit board assembly.

German patent document DE 4236268 to Walter published May 27, 1993 discloses a printed circuit board assembly having a daughter board mounted on a mother board in a substantially perpendicular fashion. Lugs of the daughter board are inserted into matching apertures in the mother board connecting electrical traces on the daughter board to electrical traces on the mother board. Aligned electrical traces are permanently connected when immersed in a solder bath.

U.S. Pat. No. 3,624,587 issued to Albert R. Conrad Nov. 30, 1971 discloses connectors for directly mounting and electrically interconnecting two or more printed circuit boards in a substantially perpendicular fashion. A first printed circuit board is mounted on a second printed circuit board by means of a connector structure formed in the second printed circuit board. The first printed circuit board includes fingerlike insertion strips that are inserted in openings in the second printed circuit board. Electrical contact is made between conductive paths of the insertion strips and wire segments in the openings. The assembly can be soldered. A pair of channels are attached to the second printed circuit board. These channels guide the first printed circuit board into assembly with the second printed circuit board and provide additional support for the first printed circuit board.

U.S. Pat. No. 6,496,384 issued to Jorge Morales et al. Dec. 17, 2002 discloses a circuit board assembly having a first circuit board connected to a second printed circuit board in a substantially perpendicular fashion. The first circuit board defines an aperture, and the second circuit board defines an edge. Respective conductive features of the circuit boards are placed in electrical communication with each other when the edge is disposed in the aperture. Thereafter, a solder joint may connect the first and second printed circuit boards.

SUMMARY OF THE INVENTION

This invention provides a printed circuit board assembly that connects a first printed circuit board to a second printed circuit board in a substantially perpendicular fashion. The first printed circuit board has a plurality of male terminal tabs extending from an edge, and the second printed circuit board has one or more slots that receive the male terminal tabs. The male terminal tabs connect to a plurality of complimentary female terminals in the slot or slots. The printed circuit board assembly further includes a pair of blade terminals that stabilize the support of one printed circuit board on the other and connect electrical traces of the respective printed circuit boards.

In one aspect the printed circuit board assembly preferably connects a first printed circuit board to a second printed circuit board mechanically as well as electrically. The first printed circuit board preferably has a plurality of male terminal tabs that are cut into an edge of the printed circuit board, while the second printed circuit board preferably defines a similar number of complementary female terminals within one or more slots. The male terminal tabs are press-fit into the female terminal slots forming a mechanical connection between the printed circuit boards as well as electrical connections between respective electrical traces of both printed circuit boards. Connector blades are preferably included to strengthen the mechanical connection of the printed circuit boards in a substantially perpendicular arrangement, to dampen vibrations and to reduce strain upon electrical circuit interfaces. The connector blades may be used for electrical connections in an electrical circuit such as a power feed circuit or circuits.

In another aspect, the printed circuit board assembly may use an alternate printed circuit board that includes an elongate slot that has a plurality of female terminals that receive respective ones of a plurality of male terminal tabs. This alternate printed circuit board may be made by providing a printed circuit board having an elongate slot that is metal clad. The printed circuit board is then punched or drilled to divide the elongate metal clad slot into a plurality of electrically isolated female terminals for the respective male terminal tabs.

DETAILED DESCRIPTION OF THE PREFERRED EMBODIMENTS

Figure 1:
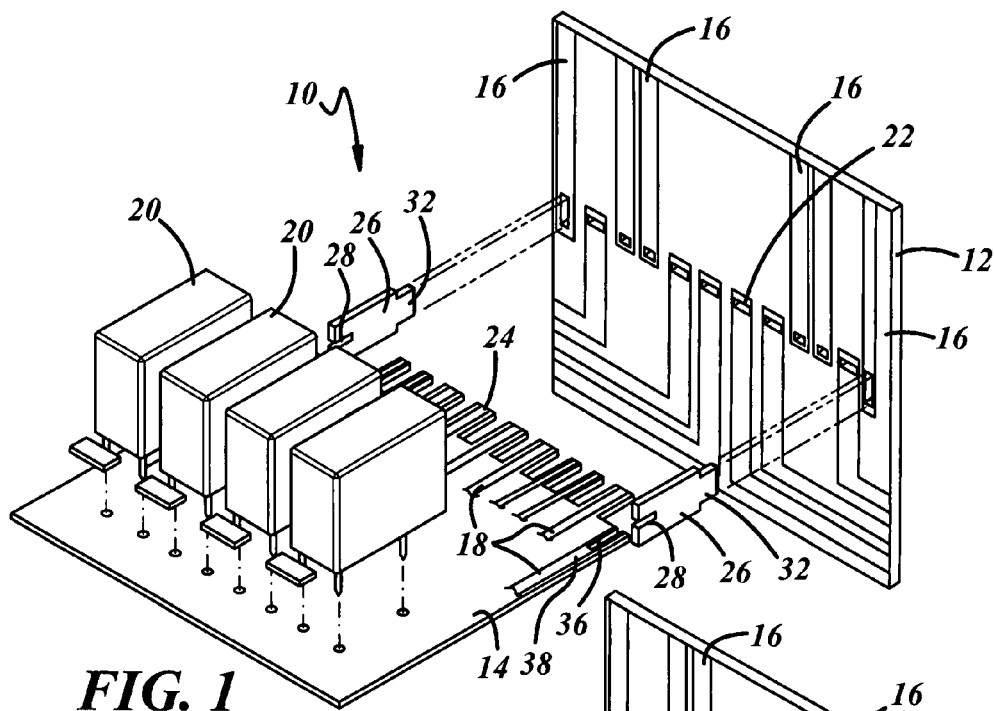
FIG. 1 is an exploded perspective view of a printed circuit board assembly that includes an embodiment of the invention.

Referring now to FIG. 1 an exploded perspective view of a printed circuit board assembly 10 includes an illustrated embodiment of the invention. Assembly 10 comprises a first printed circuit board 12 that is generally referred to as a mother board and a second printed circuit board 14 that is generally referred to as a daughter board. Printed circuit boards that have electrical traces that are part of one or more electrical circuits that include electrical components mounted on the printed circuit boards are well known and need not be shown in detail. Consequently, printed circuit board 12 is merely illustrated as having a number of electrical traces 16 that are part of one or more electrical circuits that include electrical components mounted on printed circuit board 12 that are not shown. On the other hand, printed circuit board 14 is shown as not only having a number of electrical traces 18 but also as having a number of representative electrical components 20 mounted on the printed circuit board 14.

A daughter board is typically attached to a mother board in a substantially perpendicular fashion to form a printed circuit board assembly. Consequently, printed circuit board 12 is shown attached to printed circuit board 14 in a substantially perpendicular fashion in FIG. 2 to illustrate printed circuit board assembly 10. Several electrical connections are made between the first printed circuit board 12 and the second printed circuit board 14 via the electrical traces 16 and 18. To this end, printed circuit board 12 has a plurality of aligned slots that are clad with metal, preferably tin or solder plated copper, on at least one side to form female terminal slots 22 as best shown in FIG. 3. Printed circuit board 14 on the other hand, has a plurality of finger like projections clad with metal, preferably tin or solder plated copper, on at least one side to form male terminal tabs 24 that fit into the plurality of female terminal slots 22, preferably on a one-to-one basis. At least some of the male terminal tabs 24 support electrical traces 18 while the mating female terminal slot 22 has its metal coating connected to its associated electrical trace thus electrically connecting selected electrical traces 16 of printed circuit board 12 to selected electrical traces 18 of printed circuit board 14.

At least two additional mechanical connections are made between printed circuit board 12 and printed circuit board 14. These additional mechanical connections are made by two connector blades 26 that are substantially perpendicular to both printed circuit boards 12 and 14. A typical connector blade 26 may comprise a flat metal stamping having a slot 28 at one end to receive a connector portion 30 of printed circuit board 14 and a tab 32 at an opposite end for insertion into a connector portion 34 of printed circuit board 12.

Figure 2:
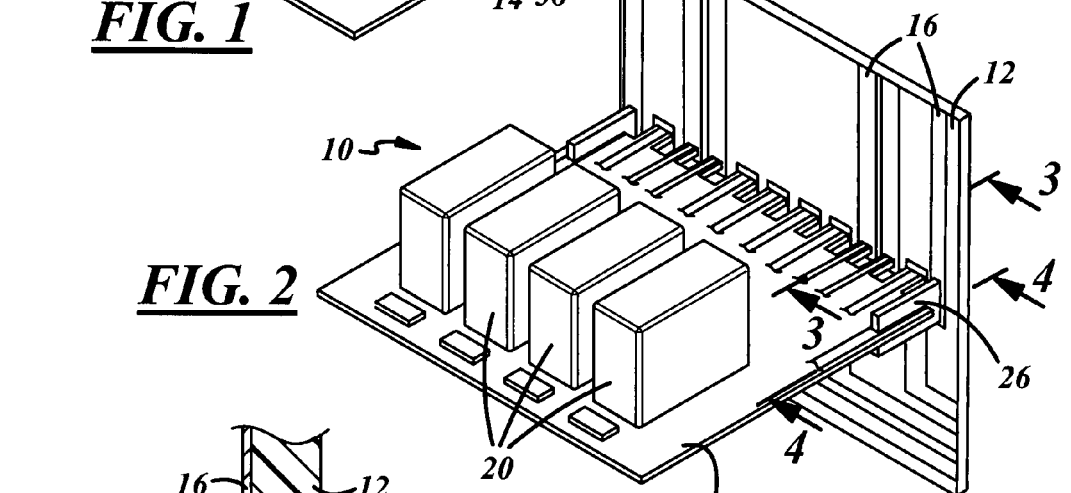
FIG. 2 is a perspective view of the printed circuit board assembly that is shown in FIG. 1.
Figure 3:
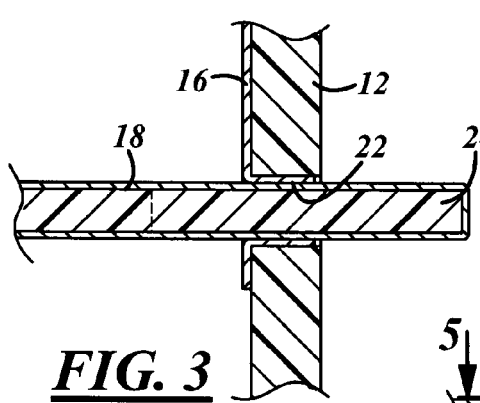
FIG. 3 is a section taken substantially along the line 3-3 of FIG. 2 looking in the direction of the arrows.

Printed circuit board 14 preferably has a connector portion 30 at a forward edge on each side as shown in FIGS. 1 and 2. The typical connector portion 30 comprises a slot 36 that extends from the forward edge of printed circuit board 14 to a mounting strip 38 at an inner end of slot 36. Slot 36 preferably has a width that is slightly less than the thickness of connector blade 26 and the mounting strip 38 is preferably clad with a metal such as copper so as to form an electrical terminal for a trace 18 of the printed circuit board 14 as best shown in FIG. 3. Slot 28 on the other hand preferably has a width that that is slightly less than the thickness of the mounting strip 38. Thus connector blade 26 is force fit onto mounting tab 38 as well as into the slotted end of printed circuit board 14. Moreover, connector blade 26 may serve as an electrical terminal for a trace 18 of the printed circuit board 14.

Figure 4:
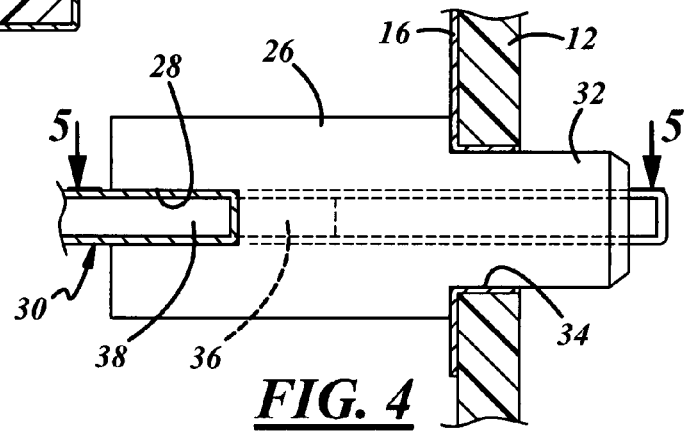
FIG. 4 is a section taken substantially along the line 4-4 of FIG. 2 looking in the direction of the arrows.
Figure 5:
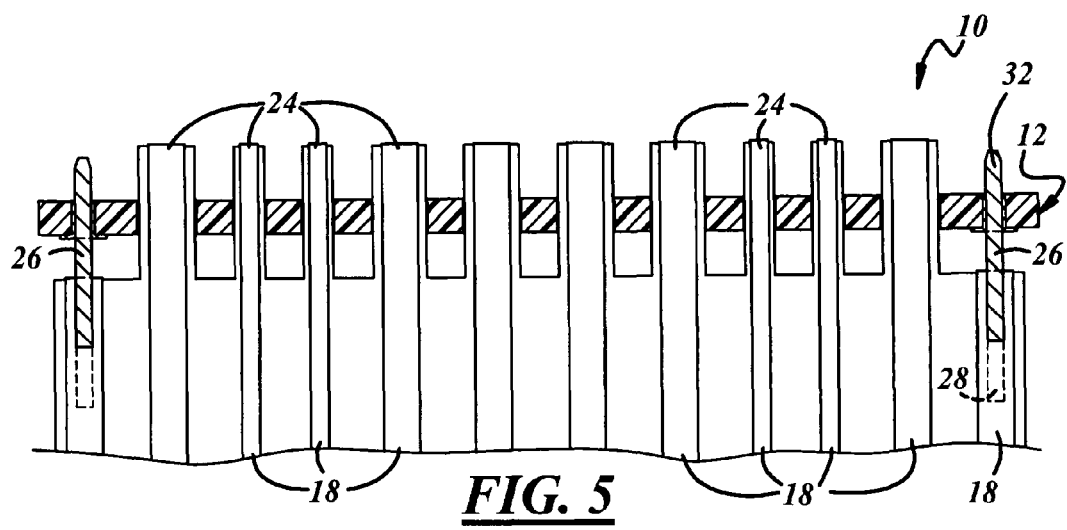
FIG. 5 is a section taken substantially along the line 5-5 of FIG. 4 looking in the direction of the arrows.

As indicated above, connector blade 26 has a tab 32 at one end that connects to a connector portion 34 of the printed circuit board 12. Connector portion 34 preferably comprises a vertical slot as best shown in FIG. 1. The vertical connector slot 34 preferably has a height and a width that are slightly less than the height and thickness of tab 32 at the end of connector blade 26 so that the tab 32 is force fit into the vertical connector slot 34 of printed circuit board 12. The vertical connector slot 34 is also preferably clad with a metal such as copper so as to form an electrical terminal for a trace 16 of printed circuit board 12 as best shown in FIG. 4. Thus connector blades 26 not only enhance the mechanical connection between the printed circuit boards 12 and 14, but the connector blades 26 may also serve as electrical terminals to connect selected traces 16 of printed circuit board 12 to selected traces 18 of printed circuit board 14. The selected traces 16 and 18 connected electrically by connector blades 26 may thus form part of a common electric circuit that may be for instance a power circuit for the printed circuit boards.

Blade connectors 26 are preferably located near the opposite sides of printed circuit board 14 for maximum effectiveness in supporting printed circuit board 14 on printed circuit board 12 in a substantially perpendicular fashion. Moreover, when connector blades 26 as used as electrical terminals for traces 16 and 18, the connector blades 26 can be soldered to electrical terminals and traces of the printed circuit boards 12 and 14 to further strengthen the mechanical connection between the printed circuit boards 12 and 14.

Figure 6:
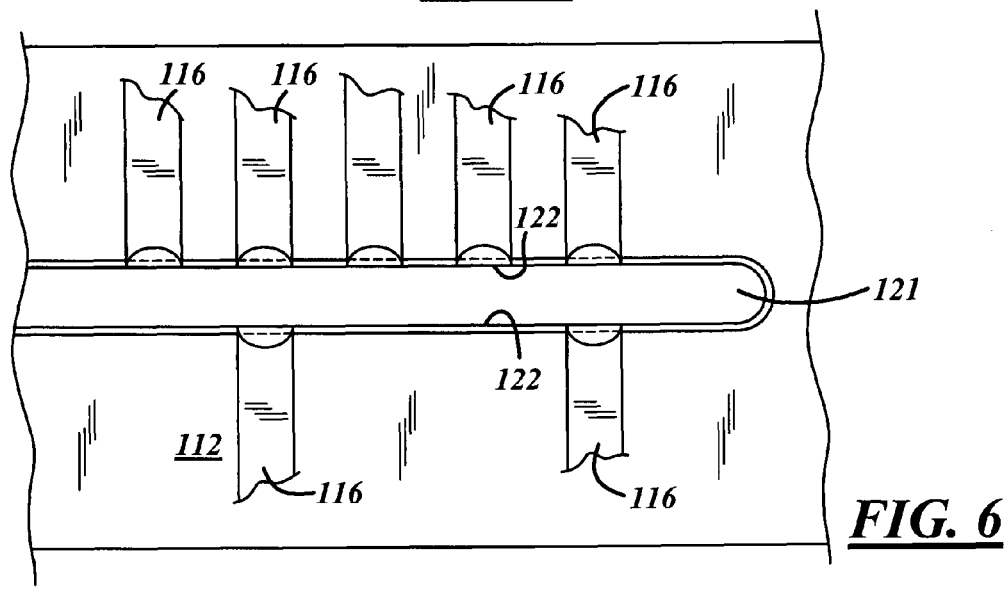
FIG. 6 is a plan view of an alternate printed circuit board in the process of being made in accordance with a method of the invention.
Figure 7:
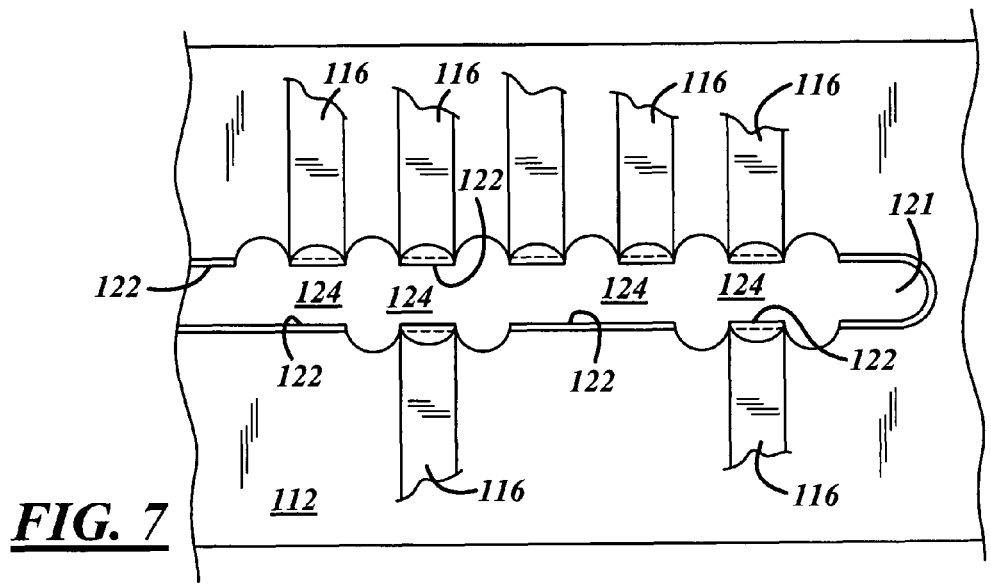
FIG. 7 is a plan view of the printed circuit board of FIG. 6 after further processing.
Figure 8:
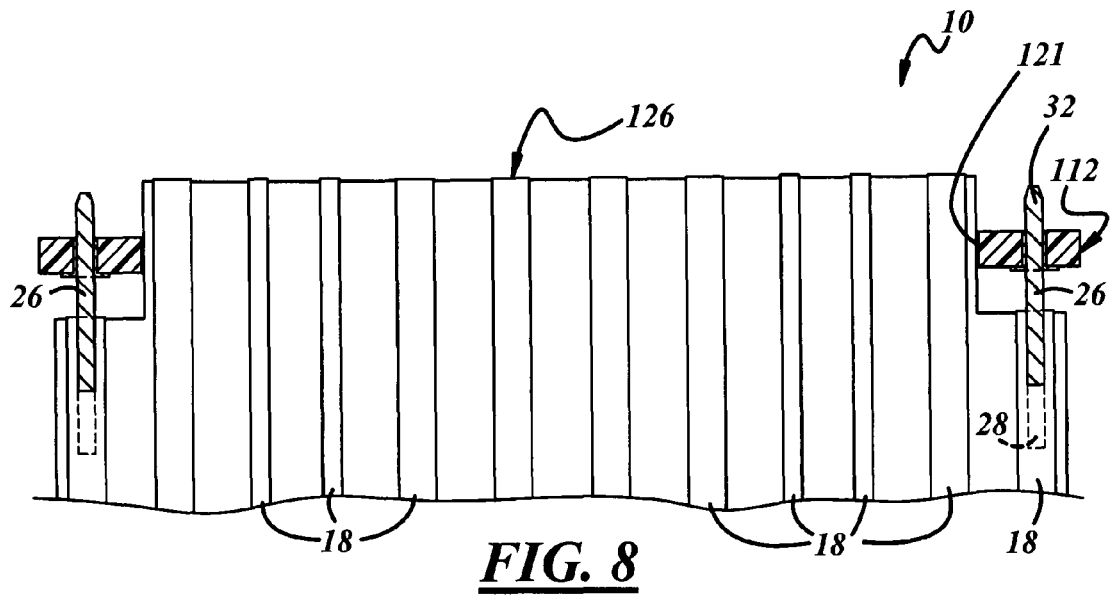
FIG. 8 is a plan view of an alternate printed circuit board having an elongate slot that is attached to the alternate printed circuit board that is shown in FIGS. 6.
Figure 9:
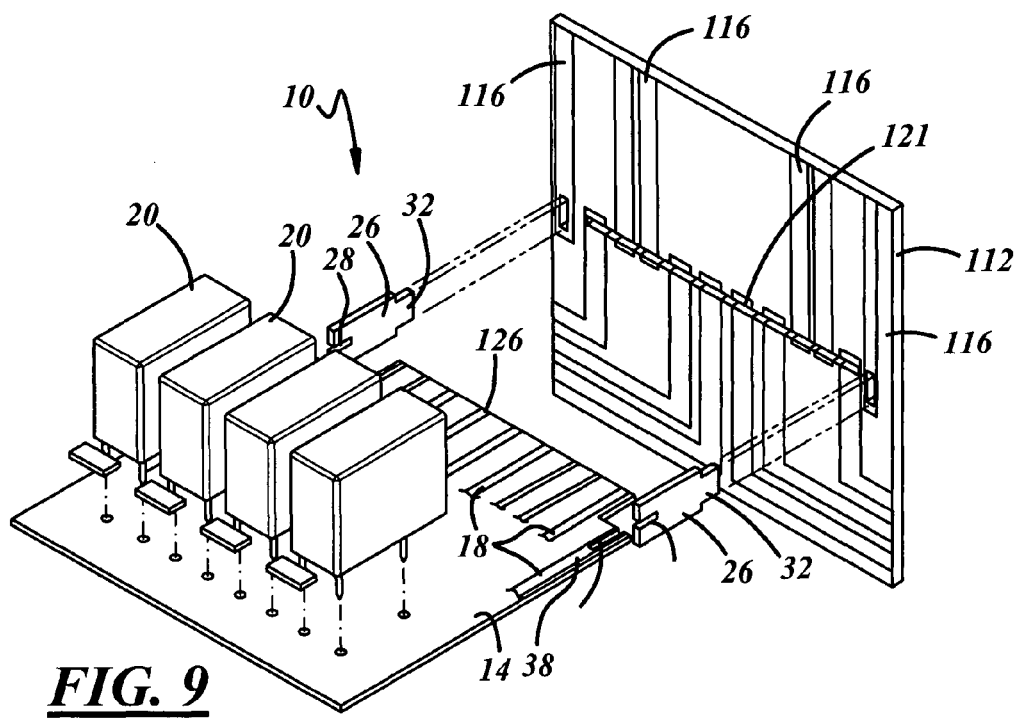
FIG. 9 is an exploded perspective view of an alternate printed circuit board assembly that includes the alternate printed circuit board having the elongate slot that is shown in FIG. 8.

FIGS. 6 and 7 shows a method of making an alternate printed circuit board 112 that can be used in place of printed circuit board 12 in printed circuit board assembly 10. Printed circuit board 112 has an elongate slot 121 that is associated with several traces 116 of the printed circuit board 112. In this instance, elongate slot 121 is initially clad on both sides substantially from end-to-end with an electrically conductive metal 122 such as copper, as shown in FIG. 6. Printed circuit board 112 is then punched through the elongate slot 121 and clad metal 122 at several places to provide a plurality of female terminals 124 that are associated with one or more of independent electrical traces 116 respectively as shown in FIG. 7. This elongate slot 21 allows the male terminal tabs 24 to become part of a single slab 126 with multiple traces 18 as shown in FIGS. 8 and 9.

It will be readily understood by those persons skilled in the art that the present invention is susceptible of broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

We claim:

1. A printed circuit board assembly, comprising:
    a first printed circuit board having a plurality of electrical traces and a second printed circuit board having a plurality of electrical traces, the first printed circuit board being attached to the second printed circuit board in a substantially perpendicular fashion, the first printed circuit board having a plurality of male terminal tabs that fit into a plurality of female terminals of the second printed circuit board to make a plurality of electrical connections between the electrical traces of the first printed circuit board and the electrical traces of the second printed circuit board; and
    at least two mechanical connections between the first printed circuit board and the second printed circuit board, the at least two mechanical connections including connector blades that are substantially perpendicular to the first printed circuit board and to the second printed circuit board,
    wherein the connector blades connect at least one of the electrical traces of the first printed circuit board to at least one of the electrical traces of the second printed circuit board, and
    wherein the connector blades each have a slot at one end that receives a connector portion of the first printed circuit board and a tab at an opposite end that is inserted into a vertical slot in the second printed circuit board to support the first printed circuit board on the second printed circuit board as well as make electrical connections between the electrical traces of the first printed circuit board and the electrical traces of the second printed circuit board, and
    wherein the plurality of female terminals are part of a common elongate slot through the second printed circuit board and the male terminal tabs are part of a common slab.

* * * * *